US009547056B2

(12) United States Patent
Duensing

(10) Patent No.: US 9,547,056 B2
(45) Date of Patent: Jan. 17, 2017

(54) DYNAMIC MODIFICATION OF RF ARRAY COIL/ANTENNA IMPEDANCE

(75) Inventor: George Randall Duensing, Gainesville, FL (US)

(73) Assignee: KONINKLIJKE PHILIPS N.V., Eindhoven (NL)

( * ) Notice: Subject to any disclaimer, the term of this patent is extended or adjusted under 35 U.S.C. 154(b) by 508 days.

(21) Appl. No.: 14/240,448

(22) PCT Filed: Sep. 4, 2012

(86) PCT No.: PCT/IB2012/054554
§ 371 (c)(1),
(2), (4) Date: Feb. 24, 2014

(87) PCT Pub. No.: WO2013/035033
PCT Pub. Date: Mar. 14, 2013

(65) Prior Publication Data
US 2014/0203804 A1    Jul. 24, 2014

Related U.S. Application Data

(60) Provisional application No. 61/531,807, filed on Sep. 7, 2011.

(51) Int. Cl.
*G01R 33/36*     (2006.01)
(52) U.S. Cl.
CPC ....... *G01R 33/3628* (2013.01); *G01R 33/3621* (2013.01)

(58) Field of Classification Search
CPC .................. G01R 33/3628; G01R 33/3621
See application file for complete search history.

(56) References Cited

U.S. PATENT DOCUMENTS 8,981,774 B2    3/2015   Leussler
2003/0173966 A1   9/2003   Scott et al.
(Continued)

OTHER PUBLICATIONS

Porter et al, "A Sixteen Channel Multiplexing Upgrade for Single Channel Receivers", Magnetic Resonance Imaging, vol. 19, No. 7, Jan. 1, 2001, pp. 1009-1016.

*Primary Examiner* — Rodney Bonnette

(57) ABSTRACT

A magnetic resonance (MR) system (10) minimizes noise for modes of an array of coils ($28_1, 28_2, \ldots, 28_n$). The system (10) includes an array of coils ($28_1, 28_2, \ldots, 28_n$) which share impedance. A plurality of preamplifiers ($30_1, 30_2, \ldots, 30_n$) receive a plurality of signals from the array of coils ($28_1, 28_2, \ldots, 28_n$), and a plurality of matching circuits ($32_1, 32_2, \ldots, 32_n$) impedance match the array of coils ($28_1, 28_2, \ldots, 28_n$) to the plurality of preamplifiers ($30_1, 30_2, \ldots, 30_n$). A plurality of receivers ($36_1, 36_2, \ldots, 36_n$) oversample the plurality of preamplified signals at a plurality of different match values. Thereafter, a plurality of separate images may be reconstructed from the oversampled data, each image corresponding to a particular match value. Finally, the image with the highest SNR may be selected.

15 Claims, 1 Drawing Sheet

(56) References Cited

U.S. PATENT DOCUMENTS

| | | | |
|---|---|---|---|
| 2008/0309340 A1* | 12/2008 | Cho | G01R 33/34046 324/318 |
| 2009/0096455 A1 | 4/2009 | Biber et al. | |
| 2009/0134873 A1* | 5/2009 | Cho | G01R 33/3415 324/318 |
| 2009/0224763 A1 | 9/2009 | Duensing | |
| 2009/0289630 A1* | 11/2009 | Nascimento | G01R 33/365 324/307 |
| 2010/0256481 A1 | 10/2010 | Mareci et al. | |
| 2011/0074415 A1* | 3/2011 | Chu | G01R 33/3415 324/309 |
| 2014/0228672 A1* | 8/2014 | Duensing | G01R 33/365 600/410 |

\* cited by examiner

US 9,547,056 B2

DYNAMIC MODIFICATION OF RF ARRAY COIL/ANTENNA IMPEDANCE

CROSS-REFERENCE TO PRIOR APPLICATIONS

This application is the U.S. National Phase application under 35 U.S.C. §371 of International Application No. PCT/IB2012/054554, filed on Sep. 4, 2012, which claims the benefit of U.S. Provisional Patent Application No. 61/531,807, filed on Sep. 7, 2011. These applications are hereby incorporated by reference herein.

The present application relates generally to radiofrequency (RF) arrays. It finds particular application in conjunction with magnetic resonance imaging (MRI) and magnetic resonance spectroscopy (MRS), and will be described with particular reference thereto. However, it is to be understood that it also finds application in other usage scenarios, such as radar, mobile communication, radio astronomy, and so on, and is not necessarily limited to the aforementioned application.

Magnetic resonance (MR) systems typically employ multiple receive channels, each corresponding to a receive coil, for data acquisition. Such an approach advantageously allows faster data acquisition, but can prove expensive since components must be duplicated for each receive channel. Hence, some systems employ a single receive channel for multiple receive coils by oversampling and time division multiplexing data from multiple receive coils. These systems recognize that modern receivers generally collect more data samples than are necessary. For more information regarding multiplexed systems, attention is directed to Porter et al., "A Sixteen Channel Multiplexing Upgrade for Single Channel Receivers", Magnetic Resonance Imaging, Volume 19, Issue 7, pp. 1009-1016 (2001).

Despite the approach for data acquisition, one challenge with employing multiple receive coils is optimizing the signal-to-noise ratio (SNR). The SNR of multiple receive coils is typically optimized by noise matching each receive coil to a preamplifier using port impedance of the receive coil when all other receive coils are approximately in the "open" state and therefore assumed to be in isolation. However, this approach produces less than optimal SNR in some modes and combinations of modes. The present application recognizes that receive coils generally have shared impedance. As such, the impedance that determines noise figure is not the port impedance, but the eigenvalues of the shared impedance. As long as there is shared impedance between receive coils, a passive noise matching circuit between each receive coil and a preamplifier cannot produce optimal SNR for all modes.

The present application provides new and improved systems and methods which overcome the above-referenced problems and others.

In accordance with one aspect, a magnetic resonance (MR) system with noise figure minimization for modes of an array of coils is provided. The system includes an array of coils which share impedance. A plurality of preamplifiers receive a plurality of signals from the array, and a plurality of matching circuits impedance match the array to the preamplifiers. A plurality of receivers oversample the preamplified signals at a plurality of different match values.

In accordance with another aspect, a method for noise figure minimization for modes of an array of coils employed in a magnetic resonance (MR) system. A plurality of signals are received from an array of coils which share impedance. The signals are preamplified using a plurality of preamplifiers, and the array is impedance matched to the preamplifiers. The preamplified signals are oversampled at a plurality of different match values.

One advantage resides in a possible improvement in SNR at relatively deep internal structures.

Another advantage resides in improved parallel imaging by increasing the SNR of several modes.

Another advantage resides in relatively low cost compared to other solutions to SNR degradation from mutual inductance.

Still further advantages of the present invention will be appreciated to those of ordinary skill in the art upon reading and understand the following detailed description.

The invention may take form in various components and arrangements of components, and in various steps and arrangements of steps. The drawings are only for purposes of illustrating the preferred embodiments and are not to be construed as limiting the invention.

Figure 1:
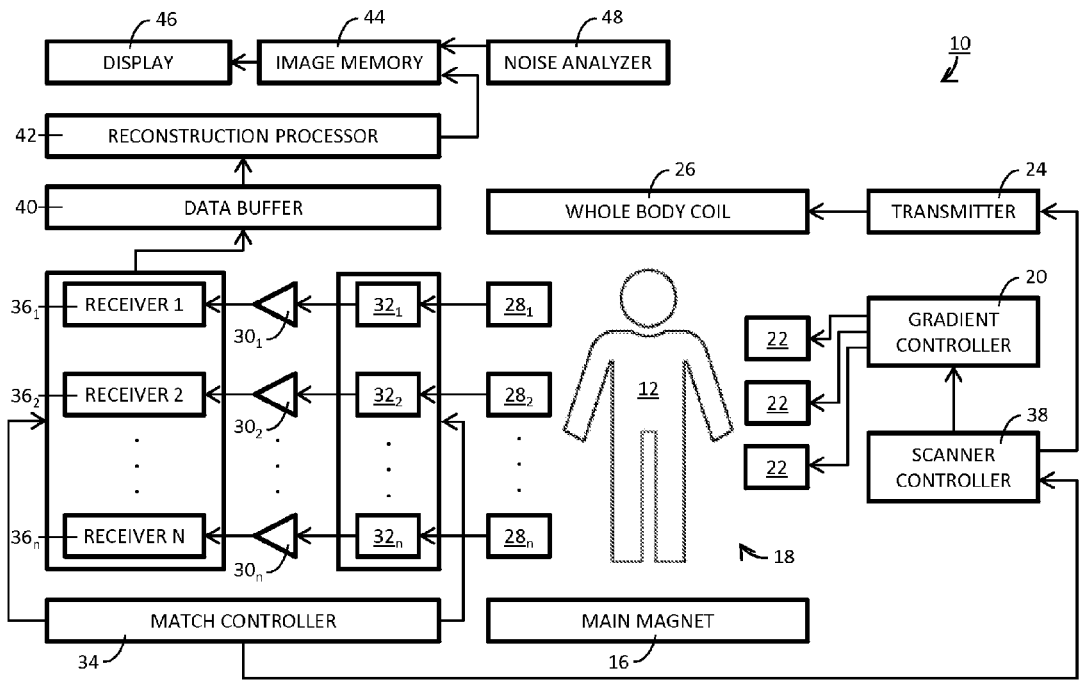
FIG. 1 is a block diagram of a magnetic resonance system according to aspects of the present disclosure.

With reference to FIG. 1, a magnetic resonance (MR) system 10 utilizes magnetic resonance to form two- or three-dimensional images of a subject 12. The subject 12 is arranged in a strong, static $B_0$ magnetic field, which causes hydrogen dipoles in the subject 12 to preferentially align to the static $B_0$ magnetic field. Applying an electromagnetic field, such as an RF pulse, at an excitation frequency, such as the Larmor frequency or MR frequency, to the hydrogen dipoles causes the hydrogen dipoles to absorb energy and resonate. The absorbed energy and the excitation frequency are dependent upon the strength of the magnetic field and the hydrogen dipole to be resonated.

After the resonance excitation pulse, the hydrogen dipoles decay to a lower energy state and emit the absorbed energy as a magnetic resonance signal. The excited hydrogen dipoles decay at different rates depending on the tissue within which the hydrogen dipoles reside. Further, the frequency and phase of the resonance signal depends on the strength of the magnetic field, such that magnetic field gradients can be employed to encode spatial information in the resonance signal. Hence, by applying magnetic field gradients and observing the decay of the hydrogen dipoles, as well as the frequency and phase of the emitted resonance signal, two- or three-dimensional images can be formed.

A main magnet 16 creates a strong, static $B_0$ magnetic field extending through an examination volume 18. The examination volume 18 accommodates the subject 12. The static $B_0$ magnetic field in a bore-type MR scanner typically extends through the examination volume 18 along the length of the subject 12. In an open or C-type MR scanner, the $B_0$ magnetic field typically extends vertically, transverse to the length of a prone patient. Further, the strength of the static $B_0$ magnetic field is commonly one of 0.23 Tesla, 0.5 Tesla, 1.5 Tesla, 3 Tesla, 7 Tesla, and so on in the examination region 18, but other strengths are contemplated. In some embodiments, the main magnet 16 is a superconducting magnet disposed in suitable cryogenic refrigeration. In other embodiments, the main magnet 16 is a resistive magnet, optionally cooled by water or the like. For higher static $B_0$ magnetic fields, bore or solenoid magnets are commonly used, and for lower static $B_0$ magnetic fields, open or C-type magnets are often used.

A gradient controller 20 controls a plurality of magnetic field gradient coils 22 to selectively superimpose magnetic field gradients, such as x, y and z gradients, on the static $B_0$ magnetic field in the examination volume 18. A transmitter 24 transmits $B_1$ resonance excitation and manipulation RF pulses into the examination volume 18 via a whole body coil 26. The $B_1$ pulses are typically of short duration and, when taken together with magnetic field gradients, achieve a selected manipulation of magnetic resonance. For example, the $B_1$ pulses excite the hydrogen dipoles to resonance and the magnetic field gradients encode spatial information in the frequency and phase of the resonance signal.

A plurality of receive coils $28_1, 28_2, \ldots, 28_n$ form an array which receives the spatially encoded magnetic resonance signal. The spatially encoded magnetic resonance signal is suitably embodied by a plurality of signals, one for each of the receive coils $28_1, 28_2, \ldots, 28_n$. The receive coils $28_1, 28_2, \ldots, 28_n$ inherently couple and share impedances. Substantially any number of receive coils can be used and the coils can have substantially any spatial arrangement. In parallel imaging, such as SENSE, 8, 16 or more receive coils are positioned circumferentially around the subject 12.

A plurality of preamplifiers $30_1, 30_2, \ldots, 30_n$ receive the signals from the receive coils $28_1, 28_2, \ldots, 28_n$ via a plurality of matching circuits $32_1, 32_2, \ldots, 32_n$ disposed between the receive coils $28_1, 28_2, \ldots, 28_n$ and the preamplifiers $30_1, 30_2, \ldots, 30_n$. The matching circuits $32_1, 32_2, \ldots, 32_n$ impedance match the receive coils $28_1, 28_2, \ldots, 28_n$ to the preamplifiers $30_1, 30_2, \ldots, 30_n$ so as to improve power transfer and SNR. Optimally, the input impedances of the preamplifiers $30_1, 30_2, \ldots, 30_n$ are the complex conjugates of the impedances of the receive coils $28_1, 28_2, \ldots, 28_n$. To facilitate impedance matching, each matching circuit includes a matching value, such as an impedance, that adds to the impedance of the corresponding receive coil. Typically, each matching circuit includes one or more of a varactor, a varicap, a varister, or the like for allowing remote adjustment of the matching value.

One challenge with impedance matching is that reactance is frequency dependent. Since the frequency varies for different modes of operation of the array, a single match value for a match circuit will be unable to optimally remove reactance between a corresponding receive coil and a corresponding preamplifier for all modes. This, in turn, degrades SNR and power transfer. To address this challenge, a match controller 34 controls the matching circuits $32_1, 32_2, \ldots, 32_n$ to switch between different match values while the resonance signal is oversampled. By oversampling the resonance signal at different match values across the range of optimal match values for all modes of the array, samples with SNR at least proximate the optimal SNR will be captured for all modes of the array. The match values can be discrete or continuous. As to the former, the match values can be changed periodically, such as every 5 seconds. As to the latter, the match values can be defined as a function of time, such as a sinusoid. Continuous match values are advantageous when it is not be feasible to switch between discrete match values quickly enough for the sampling regime due to switching impedance.

The match controller 34 further provides a synchronization signal to a plurality of receivers $36_1, 36_2, \ldots, 36_n$ and a scanner controller 38, each discussed hereafter. The synchronization signal indicates when excitation pulses should be transmitted to the examination volume 18 and when data acquisition should begin to maintain consistency with the match values. Hence, the match controller 34 ensures accurate synchronization between the matching circuits $32_1, 32_2, \ldots, 32_n$, the receivers $36_1, 36_2, \ldots, 36_n$ and the scanner controller 38. In some embodiments, the match controller 34 is part of the receivers $36_1, 36_2, \ldots, 36_n$. For example, some digital receivers can produce voltages that can be used for control of the match values of the matching circuits $32_1, 32_2, \ldots, 32_n$.

The receivers $36_1, 36_2, \ldots, 36_n$ define a plurality of receive channels, typically one for each of the receive coils $28_1, 28_2, \ldots, 28_n$, and receive the preamplified signals from the preamplifiers $30_1, 30_2, \ldots, 30_n$. The receivers $36_1, 36_2, \ldots, 36_n$ convert the plurality of preamplified signals to digital data samples, which are stored in a data buffer 40. Data acquisition is suitably triggered by a synchronization signal from the match controller 34. Commonly, the receivers $36_1, 36_2, \ldots, 36_n$ include analog-to-digital converters. In one advantageous embodiment, the preamplifiers $30_1, 30_2, \ldots, 30_n$, the matching circuits $32_1, 32_2, \ldots, 32_n$ and the receivers $36_1, 36_2, \ldots, 36_n$ are mounted on or close to the coil assembly to minimize the effects of any noise along the transmission path from the coil assembly to the receivers $36_1, 36_2, \ldots, 36_n$.

During data acquisition, the matching values are varied by the match controller 34 and the receivers $36_1, 36_2, \ldots, 36_n$ oversample the plurality of preamplified signals according to a predetermined factor. As described above, oversampling recognizes that modern receivers can typically sample data faster than is otherwise needed. When the match controller 34 switches between discrete match values, the predetermined factor typically corresponds to the number of discrete match values. For example, where the match controller 34 switches between four discrete values, the predetermined factor is four and the sample rate is four times what it traditionally is. Otherwise, for example, with continuous match values, the predetermined factor can be selected via a trial and error process and/or so as maximize the amount of data captured.

The scanner controller 38 controls the gradient controller 20 and the transmitter 24 to generate any of a plurality of MR sequences, such as echo planar imaging, echo volume imaging, gradient and spin echo imaging, fast spin echo imaging, and the like. A synchronization signal from the match controller 34 is employed to adjust the pulse sequence to start at the acquisition window. For the selected sequence, the receivers $36_1, 36_2, \ldots, 36_n$ receive at least one data line for each receive channel in rapid succession following each pulse transmitted. The receivers $36_1, 36_2, \ldots, 36_n$ perform analog-to-digital conversion of the signals received from the receive coils $28_1, 28_2, \ldots, 28_n$ and convert each MR data line to a digital format suitable for further processing. Although discussed in terms of using the whole body coil 26 to transmit the $B_1$ pulses, it is to be appreciated that the receive coils $28_1, 28_2, \ldots, 28_n$ can also be used as transmit coils.

The digital data for each receive channel, stored in the data buffer 40, is reconstructed into an image representation by a reconstruction processor 42, which applies a Fourier transform or other appropriate reconstruction algorithm. The image may represent a planar slice through the subject 12, an array of parallel planar slices, a three-dimensional volume, or the like. When the coil array is operated in a parallel imaging mode, images from the different receive channels are constructed and combined by the reconstruction processor 42 using, for example, SENSE, SMASH or some other parallel imaging technique.

In one embodiment, each receive channel outputs data for a plurality of images, each at a different match value. In the embodiment with four fold over sampling, four images are generated with each of the four matching values. The image representation is then stored in an image memory 44 where it may be accessed for converting slices, projections, or other portions of the image representation into appropriate format for visualization, for example, via a display 46 which displays the resultant image. The image representation can also be sent to storage, such as a medical records database.

Figure 2:
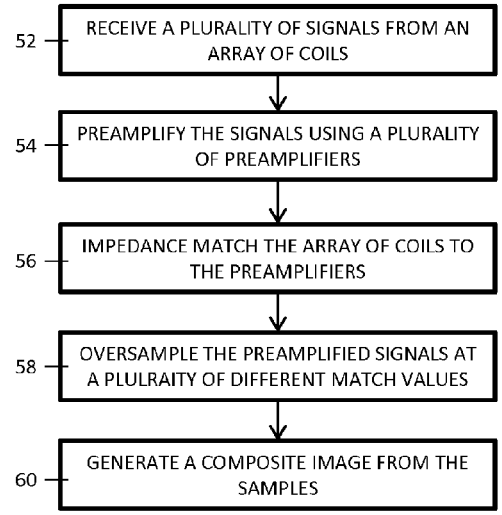
FIG. 2 is a block diagram of a method for noise figure minimization according to aspects of the present disclosure.

With reference to FIG. 2, a method 50 for noise figure minimization for all modes of the array defined by the receive coils $28_1, 28_2, \ldots, 28_n$ is provided. The method 50 includes receiving 52 a plurality of signals from the array, where the array shares impedance. The received signals are preamplified 54 using the preamplifiers $30_1, 30_2, \ldots, 30_n$, and the array is impedance matched 56 to the preamplifiers $30_1, 30_2, \ldots, 30_n$. Impedance matching is performed according to a plurality of different matching values, which vary during data acquisition. The preamplified signals are oversampled 58 at the plurality of different match values during data acquisition. A composite image is optionally generated 60 from a plurality of images generated from the samples.

In the four fold over sampling embodiment, four images are generated consecutively with each of four different matching values. The best image based on such criteria as SNR, highest resolution, contrast, or the like can be selected as the final image. Alternatively, the images are combined with various selectable weights. For example, if the images are "best" in different physical regions, the weightings can be adjusted regionally. As another example, the images are combined with equal weighting.

In another embodiment, the data from each receive channel is analyzed for SNR by a noise analyzer 48. The output of each receive channel with the highest SNR is sent to the data buffer 40 for reconstruction. In a preliminary calibration scan with the subject 12 in the imaging region, the match values can be varied through a large range of values. The match value with the least SNR is selected as one of the match values and the other three match values in the four fold oversampling embodiment can be selected around this match value. During scanning, the four output signals are again checked for SNR. Patient motion, moving the patient through the examination region, and the like can lead to an impedance change of the receive coils $28_1, 28_2, \ldots, 28_n$. If during imaging the match value with the highest SNR changes, the 4 match values can be dynamically shifted to span the new "best" match value.

In view of the foregoing discussion, oversampling the resonance signal while varying matching values advantageously allows image reconstruction from data generated with several different noise match values. This, in turn, increases the ability to approximate optimal matching for all modes and all locations of interest in imaging. Simulations suggest that SNR increases could be 15% or more for some arrays and some locations. Furthermore, if near optimal noise figure can be achieved with non-isolated array elements, then the requirement for ensuring the best isolation during manufacture can also be relaxed.

As used herein, a memory includes one or more of a non-transient computer readable medium; a magnetic disk or other magnetic storage medium; an optical disk or other optical storage medium; a random access memory (RAM), read-only memory (ROM), or other electronic memory device or chip or set of operatively interconnected chips; an Internet/Intranet server from which the stored instructions may be retrieved via the Internet/Intranet or a local area network; or so forth. Further, as used herein, a processor includes one or more of a microprocessor, a microcontroller, a graphic processing unit (GPU), an application-specific integrated circuit (ASIC), a field-programmable gate array (FPGA), and the like; a user input device includes one or more of a mouse, a keyboard, a touch screen display, one or more buttons, one or more switches, one or more toggles, and the like; and a display includes one or more of a LCD display, an LED display, a plasma display, a projection display, a touch screen display, and the like.

The invention has been described with reference to the preferred embodiments. Modifications and alterations may occur to others upon reading and understanding the preceding detailed description. It is intended that the invention be construed as including all such modifications and alterations insofar as they come within the scope of the appended claims or the equivalents thereof.

Having this described the preferred embodiments, the invention is now claimed to be:

1. A magnetic resonance (MR) system with noise figure minimization for modes of an array of coils, said system comprising:
   an array of coils which share impedance;
   a plurality of preamplifiers receiving a plurality of signals from the array of coils;
   a plurality of matching circuits impedance matching the array of coils to the plurality of preamplifiers; and,
   a plurality of receivers oversampling the plurality of preamplified signals at a plurality of different match values.

2. The MR system according to claim 1, wherein the array of coils includes a plurality of RF receive coils.

3. The MR system according to claim 1, wherein the match values correspond to impedances.

4. The MR system according to claim 1, wherein the plurality of receivers each oversample each MR signal from the corresponding coil n-times to produce n-data lines for each MR signal.

5. The MR system according to claim 4, further including:
   a match controller which cyclically selects among n-match values such that each of the n-data lines correspond to one of the n-match values.

6. The MR system according to claim 1, wherein the samples include an image for each combination of receive coil and match value.

7. The MR system according to claim 6, wherein an image with a best SNR is selected for each receive coil from the images corresponding to the receive coil.

8. The MR system according to claim 1, further including:
   a reconstruction processor which generates a composite image from a plurality of images generated from the samples.

9. A method for noise figure minimization for modes of an array of coils employed in a magnetic resonance (MR) system, said method comprising:
   receiving a plurality of signals from an array of coils which share impedance;
   preamplifying the plurality of signals using a plurality of preamplifiers;
   impedance matching the array of coils to the plurality of preamplifiers; and,
   oversampling the plurality of preamplified signals at a plurality of different match values.

10. The method according to claim 9, wherein the array of coils includes a plurality of RF receive coils.

11. The method according to claim 9, wherein the array of coils is impedance matched to the plurality of preamplifiers according to the plurality of different match values.

12. The method according to claim 9, wherein the samples include an image for each combination of receive coil and match value.

13. The method according to claim 12, further including:
selecting an image with a best SNR for each coil from the images corresponding to the receive coil.

14. The method according to claim 9, further including:
generating a composite image from a plurality of images generated from the samples.

15. The method according to claim 9, wherein the oversampling includes:
oversampling each preamplified signal n-times for each MR signal to produce n-data lines for each MR signal; and,
cyclically selecting among n-match values such that each of the n-data lines correspond to one of the n-match values.

\* \* \* \* \*